(12) United States Patent
Tuncer et al.

(10) Patent No.: US 11,598,742 B2
(45) Date of Patent: Mar. 7, 2023

(54) SEMICONDUCTOR DEVICE FOR SENSING IMPEDANCE CHANGES IN A MEDIUM

(71) Applicant: Texas Instruments Incorporated, Dallas, TX (US)

(72) Inventors: Enis Tuncer, Dallas, TX (US); Vikas Gupta, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 143 days.

(21) Appl. No.: 17/137,251

(22) Filed: Dec. 29, 2020

(65) Prior Publication Data

US 2021/0116407 A1 Apr. 22, 2021

Related U.S. Application Data

(63) Continuation of application No. 16/162,011, filed on Oct. 16, 2018, now Pat. No. 10,883,953.

(51) Int. Cl.
*H01L 21/768* (2006.01)
*G01N 27/22* (2006.01)
(Continued)

(52) U.S. Cl.
CPC ..... *G01N 27/223* (2013.01); *H01L 21/76877* (2013.01); *H01L 23/5226* (2013.01); *H01L 24/11* (2013.01); *H01L 24/17* (2013.01)

(58) Field of Classification Search
CPC .. G01N 27/223; G01N 27/221; G01N 27/226; H01L 21/76877; H01L 23/5226;
(Continued)

(56) References Cited

U.S. PATENT DOCUMENTS

| 6,034,882 A | 3/2000 | Johnson et al. |
| 10,267,757 B2 | 4/2019 | Graf et al. |

(Continued)

FOREIGN PATENT DOCUMENTS

WO 2017024309 2/2017

OTHER PUBLICATIONS

International Search Report for PCT/US 2019/056573 dated Oct. 16, 2019, 3 pages.
(Continued)

*Primary Examiner* — Kyoung Lee
*Assistant Examiner* — Christina A Sylvia
(74) *Attorney, Agent, or Firm* — Jacqueline J. Garner; Frank D. Cimino

(57) ABSTRACT

Described examples include a sensor device having at least one conductive elongated first pillar positioned on a central pad of a first conductor layer over a semiconductor substrate, the first pillar extending in a first direction normal to a plane of a surface of the first conductor layer. Conductive elongated second pillars are positioned in normal orientation on a second conductor layer over the semiconductor substrate, the conductive elongated second pillars at locations coincident to via openings in the first conductor layer. The second conductor layer is parallel to and spaced from the first conductor layer by at least an insulator layer, the conductive elongated second pillars extending in the first direction through a respective one of the via openings. The at least one conductive elongated first pillar is spaced from surrounding conductive elongated second pillars by gaps.

19 Claims, 17 Drawing Sheets

(51) Int. Cl.
*H01L 23/522* (2006.01)
*H01L 23/00* (2006.01)

(58) Field of Classification Search
CPC .............. H01L 24/11; H01L 24/17; H01L 2224/16227; H01L 2224/32225; H01L 2224/48227; H01L 2224/73265; H01L 2924/15151
See application file for complete search history.

(56) References Cited

U.S. PATENT DOCUMENTS

| | | | |
|---|---|---|---|
| 2003/0002238 A1 | 1/2003 | Toyoda | |
| 2004/0177685 A1 | 9/2004 | Yokura et al. | |
| 2008/0283991 A1* | 11/2008 | Reinert | G01P 1/023 |
| | | | 257/E23.18 |
| 2010/0124813 A1 | 5/2010 | Matamis et al. | |
| 2011/0068807 A1 | 3/2011 | Kesil et al. | |
| 2012/0260732 A1* | 10/2012 | Humbert | G01N 27/223 |
| | | | 216/13 |
| 2013/0029684 A1 | 1/2013 | Kawaguchi et al. | |
| 2018/0126038 A1 | 5/2018 | Hyun et al. | |
| 2019/0187097 A1* | 6/2019 | Li | B82B 3/0019 |

OTHER PUBLICATIONS

Maskell, B.R., "The Effect of Humidity on a Corona Discharge in Air", Technical Report 70106, Royal Aircraft Establishment, U.D.C. 533.276 : 621.3.015.532; Jun. 1970; retrieved from URL http://www.dtic.mil/dtic/tr/fulltext/u2/720090.pdf on Oct. 15, 2018.

* cited by examiner

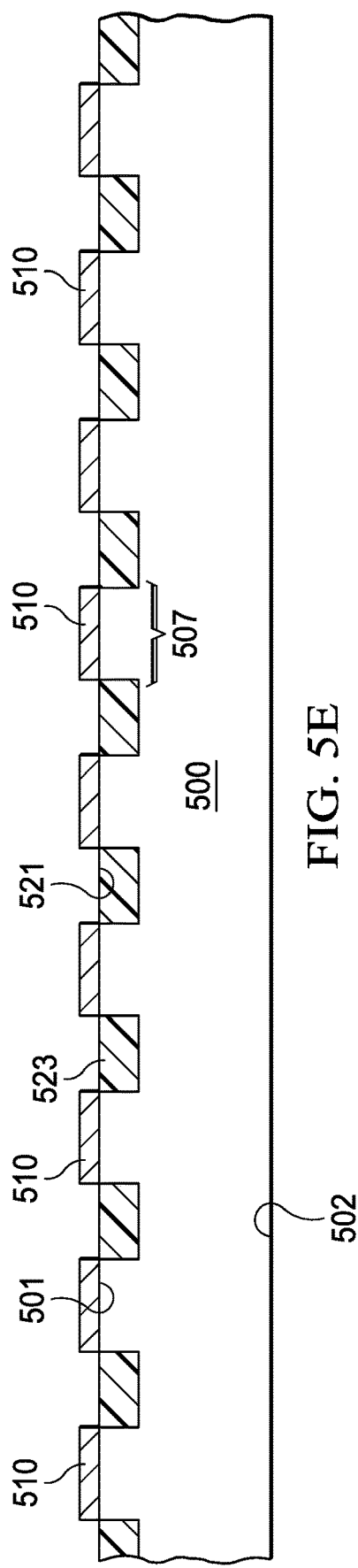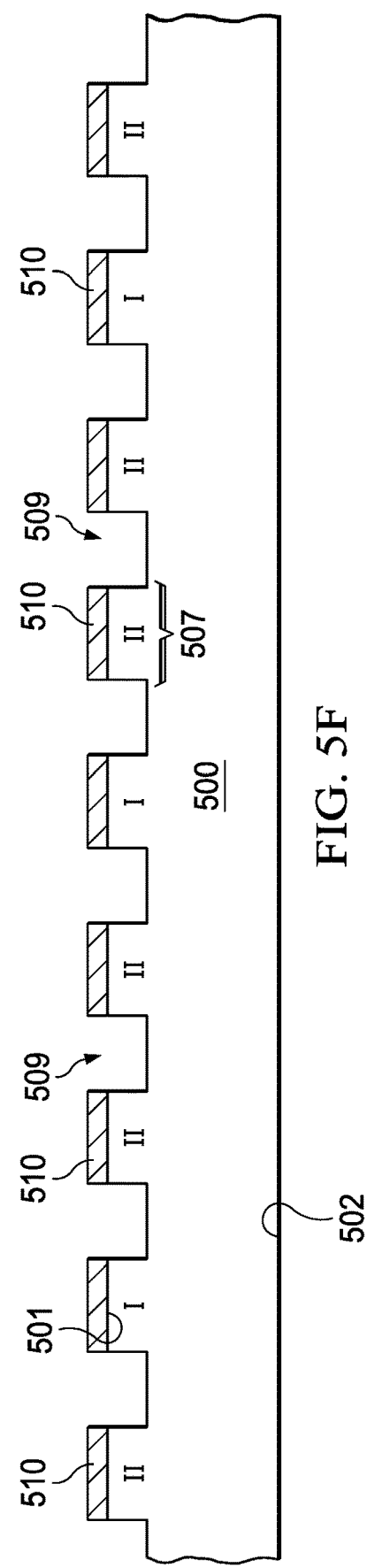

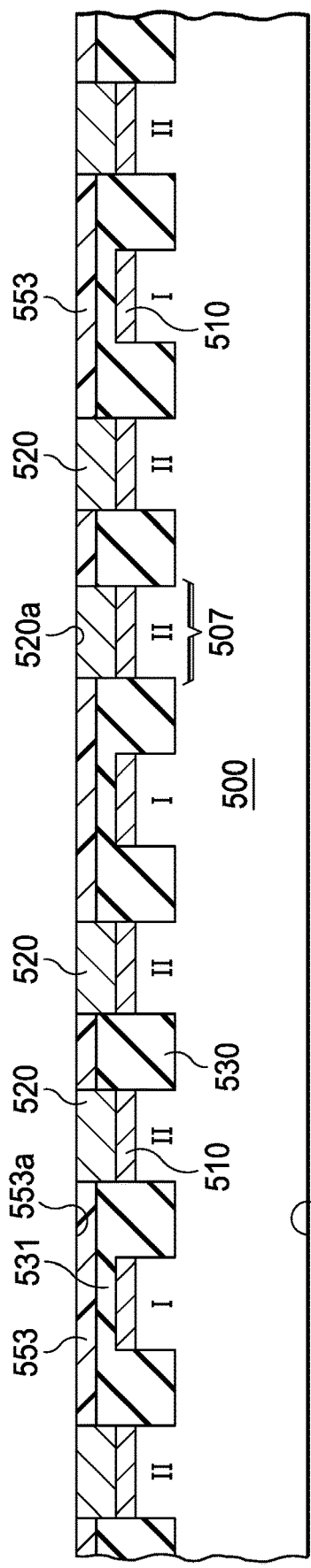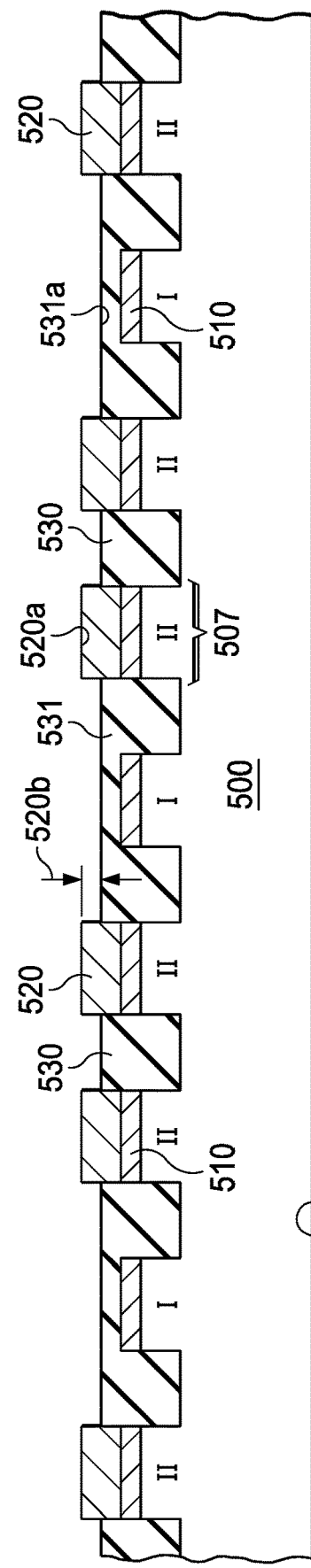

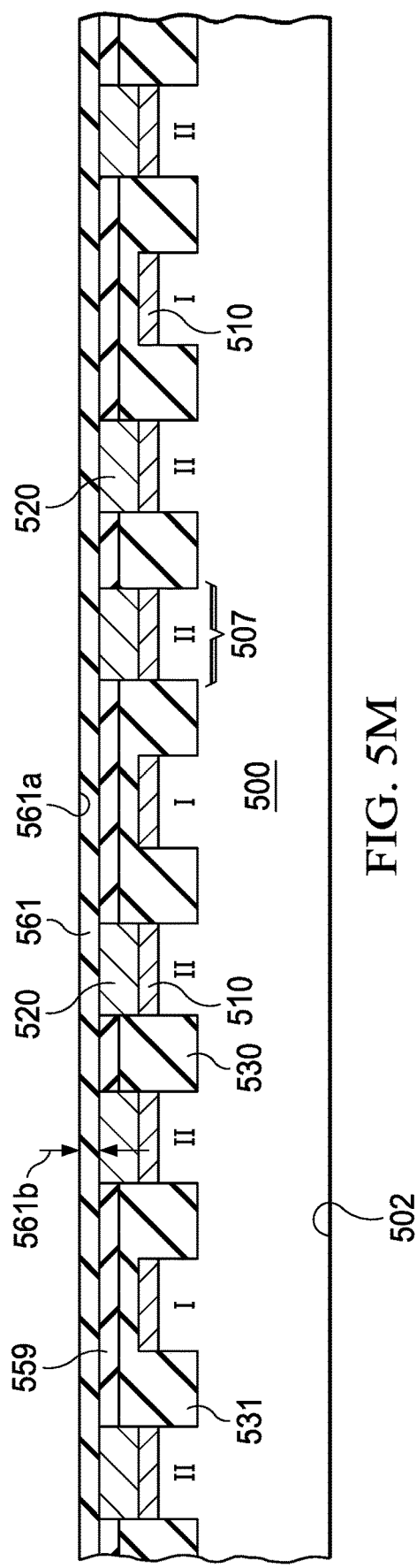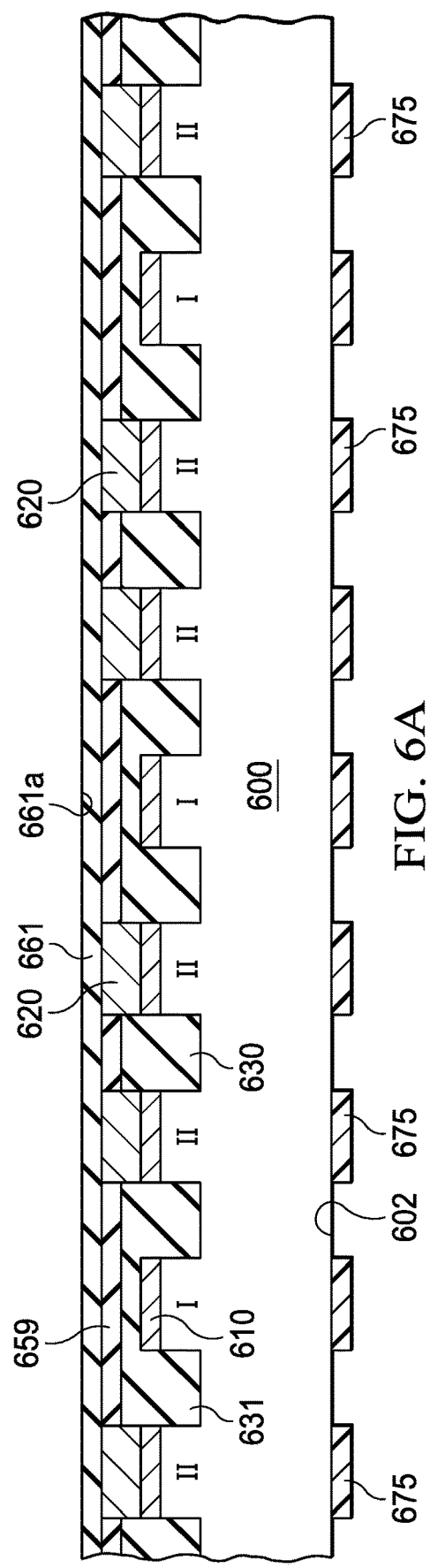

SEMICONDUCTOR DEVICE FOR SENSING IMPEDANCE CHANGES IN A MEDIUM

This application is a continuation of U.S. patent application Ser. No. 16/162,011, filed Oct. 16, 2018, the contents of all of which are herein incorporated by reference in its entirety.

TECHNICAL FIELD

This disclosure relates in general to the field of semiconductor devices and processes, and more specifically to the structure and fabrication method of semiconductor devices with sensors for measuring impedance changes.

BACKGROUND

Sensors for measuring the characteristics of a medium including, for example, moisture content, are used in electrical systems. The measurements can be made by using a material with physical characteristics that change with moisture, such as a polyimide. The material is exposed to the medium, for example air, and after time is allowed to elapse sufficient for change in the physical characteristics to occur in the material, the physical characteristics of the material are measured. The moisture sensing in these systems is indirect, that is, the moisture content in a medium such as the ambient atmosphere is not measured; instead, a material is exposed to the medium and then physical properties of the material that are sensitive to moisture are measured. Using known correlations between the material properties and a moisture level, the moisture content in the medium can be derived. For example, a look up table can be used where moisture level is stored with a physical measurement such as resistance, conductance or other measurable properties for the material that are known to change with moisture levels. The system must expose the material to the medium, wait for the material to respond to the medium, measure the physical characteristic change in the medium, and then the system derives the measured characteristic of the medium from stored measurements or correlation tables. In the example where moisture level is being measured, variance of the material response to moisture, leading to errors in the measurement, and delay in making measurements to allow the material to absorb moisture prior to measurements, can occur in indirect sensing systems.

SUMMARY

In a described example, a sensor device includes a first conductor layer spaced apart from a parallel second conductor layer by an insulator layer, the insulator layer having a thickness. The first conductor layer and the insulator layer are patterned by coincident via openings arrayed surrounding respective central pads of the first conductor layer. Conductive elongated first pillars of a first height and a first cross section is positioned on the central pads, the first pillars normal to a plane of the surface of the first conductor layer. Conductive elongated second pillars of a second height and a second cross section are positioned in normal orientation on second conductor layer locations coincident to a respective one of the via openings, with the second height equal to the sum of the first height, the thickness of the first conductor layer, and the thickness of the insulator layer, the second pillars vertical to the second conductor layer and extending through the respective via opening. The first pillars are spaced by equal gaps from the surrounding second pillars. In a further described example, a dielectric medium is in the gaps.

BRIEF DESCRIPTION OF THE DRAWINGS

FIGS. 5A-5M illustrate in a series of cross sectional views the results of steps of the methods of FIGS. 4A-4B in forming an arrangement.

FIGS. 6A-6C illustrate in cross sectional views the results of steps of FIG. 4B for forming pillars for use in the arrangements.

DETAILED DESCRIPTION

Figure 1A:
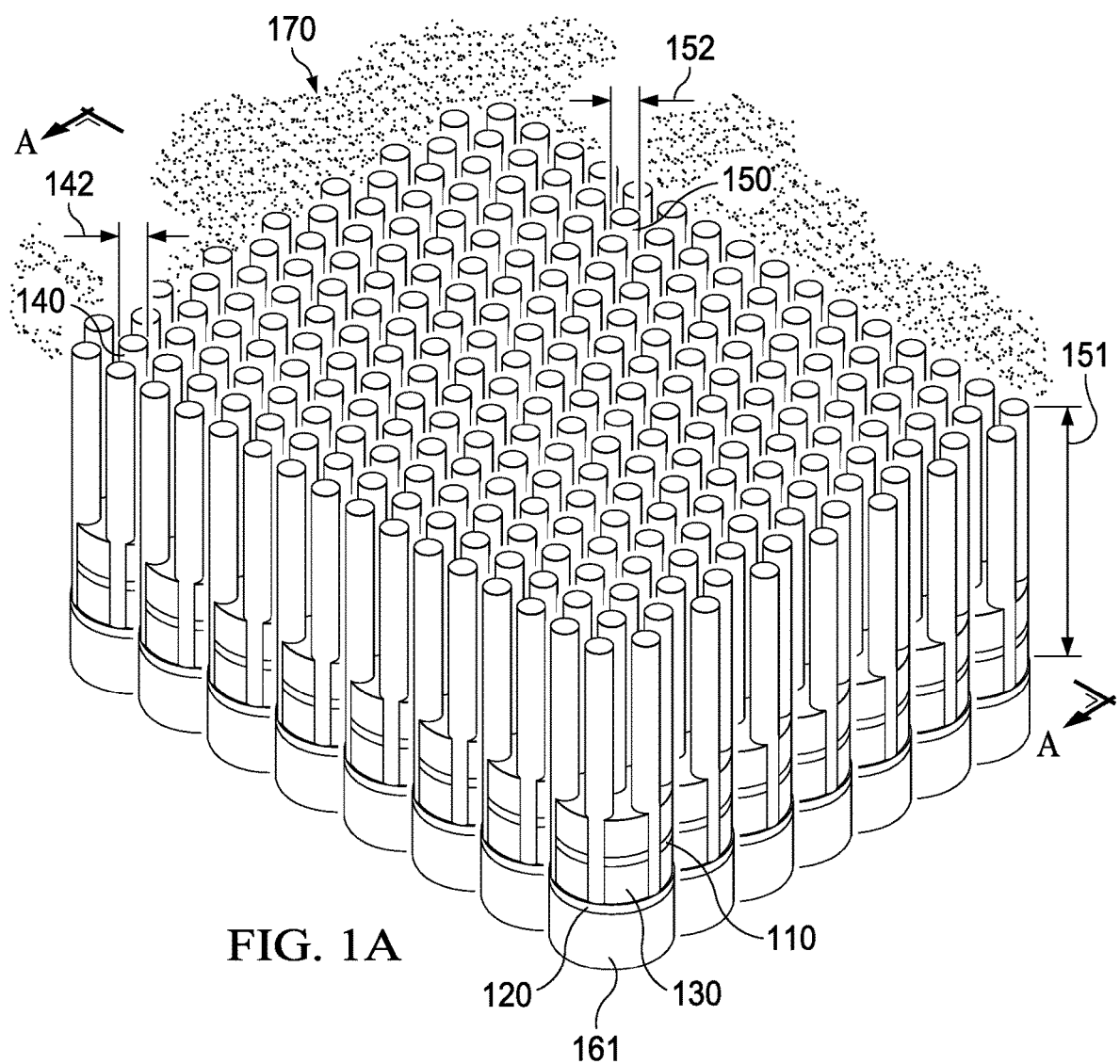
FIG. 1A illustrates an arrangement for a sensor device.

Corresponding numerals and symbols in the different figures generally refer to corresponding parts unless otherwise indicated. The figures are not necessarily drawn to scale.

In this description, the term "pillar" is used. As used herein, a pillar is a vertical structure such as a column. In this description, the term "elongated pillar" is used. As used herein, an elongated pillar is a pillar with a slender shape having substantially more length than width. In this description, the term "conductive elongated pillar" is used. As used herein, a conductive elongated pillar is an elongated pillar that is an electrical conductor. Materials for conductive elongated pillars as described herein include doped semiconductors, a metal, graphene, or composites of these, or composites of other electrically conductive materials. In this description, the term "groove" is used. As used herein, a groove is a long, narrow cut or indentation in a surface. In example processes for forming arrangements, grooves are made in a surface of a semiconductor substrate. In this description, certain elements are described as arranged in a zigzag pattern. As used herein, "zigzag" means a pattern that alternates direction having abrupt right and left turns. In example arrangements, pillars are arranged in a zigzag pattern when observed from a plan view.

In example arrangements, the problem of sensing a characteristic of a medium is solved by using direct measurement. The direct measurement is based on ionization of the medium and on detection of impedance changes in the medium. In an example, the moisture content of ambient atmosphere can be measured. The ionization current when the corona ionization occurs and the conduction in the dielectric (for example, air) are dependent on the moisture content of the dielectric, enabling a direct measurement to be made by ionizing the dielectric between electrodes and by observing the current or conduction value. The details of the relationship between ionization current and humidity in air are presented in "The Effect of Humidity on a Corona Discharge in Air", B. R. Maskell, Technical Report No. 70106, Royal Aircraft Establishment (June 1970); which is hereby incorporated herein by reference. In addition to direct moisture sensing of air, for example, impedance change sensing to another medium under ionization can be performed. These impedance changes can be used to detect moisture in gasses, detect gasses, or perform other sensing using direct sensing. By ionizing the medium, the sensors can perform direct measurements without using specific moisture sensitive materials, and without the need for making indirect measurements after exposing a material to the medium and then awaiting a change in the material. In the arrangements, structures are formed where the medium is between electrodes in a sensor. The electrodes can be used to ionize the medium. In an example the structures are capacitive structures with elongated pillars spaced from one another by a gap, and the medium is in the gap. Use of capacitive structures having small feature sizes enables ionization to occur with small voltages. However the structures can be formed at larger scale and larger voltages can be used to create an electric field for ionization of the medium. In an example arrangement, a sensor includes a first set of conductive pillars forming a first electrode, and a second set of conductive pillars forming a second electrode, the second set of pillars spaced from the first set of pillars by a gap. A voltage is applied between the electrodes to ionize a medium in the gap. The current can be observed during ionization and moisture of the medium can be determined. In another example the medium is the ambient atmosphere, or air. Other dielectric mediums can be in the gap, such as gases and biological fluids; and the ionizable molecules are ones selected from a group including water molecules, gas admixtures, and dissolved molecules.

Figure 1B:
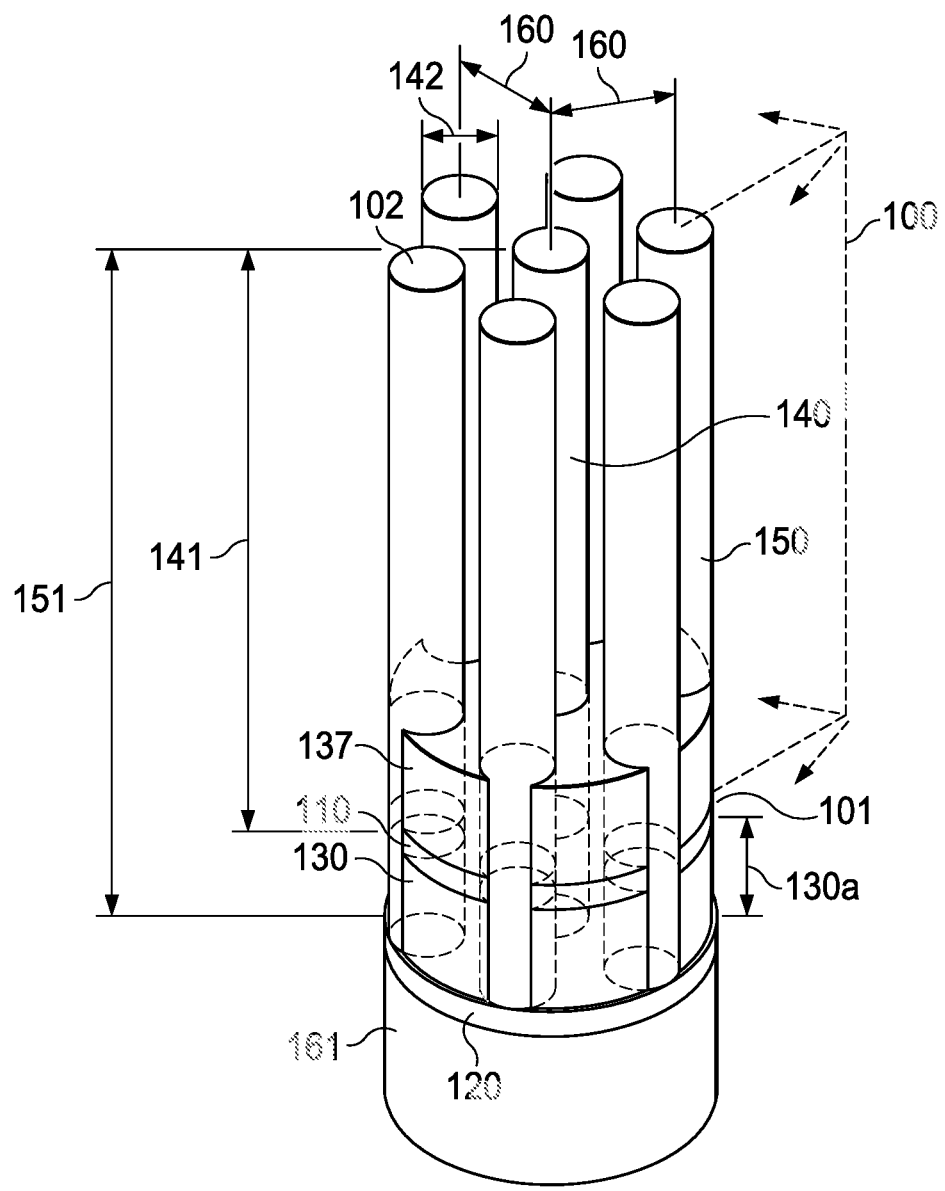
FIG. 1B is a portion of the sensor device of FIG. 1A in an enlarged view.

FIG. 1A illustrates an arrangement for a sensor device manufactured in combination with a semiconductor device, for example an integrated circuit; FIG. 1B illustrates a portion of the sensor device of FIG. 1A in enlarged view to enable easy description. The sensor device in the example arrangement shown is in principle a capacitive structure formed on a semiconductor substrate with unidirectional electrically conductive pillars. As shown in FIG. 1A, a dielectric medium 170 (for example, air) is between the pillars 140, 150. The application of a voltage difference between positive and negative sides of the structure will allow the dielectric medium between the pillars to ionize. The ionization changes the impedance of the capacitive structure, which is the electrode arrangement formed by the conductive pillars. In quantitative terms, to achieve ionization the electric field at the tips of the capacitive structure should exceed 3 V/μm; this value can be realized with either relatively large structural features and the use of relatively large voltages, or with small structural features and the use of relatively small voltages.

In FIG. 1B, line 101 represents the first surface of an original semiconductor substrate 100 made of a single-crystal semiconductor, and the pillar end surfaces 102 are portions of the second surface of the semiconductor substrate. The single-crystal semiconductor of the substrate 100 is selected from a group including silicon, silicon germanium, gallium arsenide, gallium nitride, and other III-V and II-VI compound semiconductors used in manufacturing. In an example, the pillar bodies such as 140, 150 are bulk portions of the semiconductor substrate. The semiconductor material of the substrate is doped so that the pillars are electrically conductive. Alternatively, in additional arrangements, the pillars 140, 150 may be made of a metal, graphene, or composites of these, or of other electrically conductive materials.

As FIGS. 1A and 1B illustrate, a first conductor layer 110 is spaced apart from a second conductor layer 120 by an insulator layer 130, which touches the first and the second conductor layers. The first insulator layer has a thickness 130a. First conductor layer 110 and second conductor layer 120 are parallel to each other. As described hereinbelow, elements of the arrangements are described as "parallel" to one another when the elements are intended to lie in planes that, when extended infinitely, will not meet. However, the term parallel as used herein also includes surfaces that may slightly deviate in direction due to manufacturing tolerances, if the two surfaces generally lie in planes that are spaced apart and would not intersect when extended infinitely when the surfaces were made without these deviations, the surfaces are also parallel. Parallel surfaces extend in a direction side by side and do not meet.

The first conductor layer 110 and the second conductor layer 120 are planar. As the term "planar" is used herein, a planar surface lies in one plane and is flat. However, it is understood that in manufacturing some variations on surfaces occur due to the tolerances in manufacturing, and the term planar includes surfaces intended to be flat and in one plane, even if during manufacture some deviation occurs in the surface.

A second insulator layer, designated 161 in FIG. 1B, can be formed to protect the conductor layer 120 and to provide further mechanical strength to the structure as is further described hereinbelow. Another insulator 137 is formed around portions of the pillars 140 and 150, as is further described hereinbelow.

FIGS. 1A and 1B also illustrate conductive elongated second pillars 150 of a second height 151 and a second cross section 152 positioned in normal orientation on each second pillar location on the second conductor layer 120, which is coincident with a via opening. Consequently, each second pillar 150 reaches through a respective via opening. The second height 151 is equal to the sum of the first pillar height 141, the thickness of first conductor layer 110, and the thickness of the insulator layer 130. The second pillars 150 are positioned in vertical orientation to the second conductor layer 120 and extend through the respective via openings.

Figure 2A:
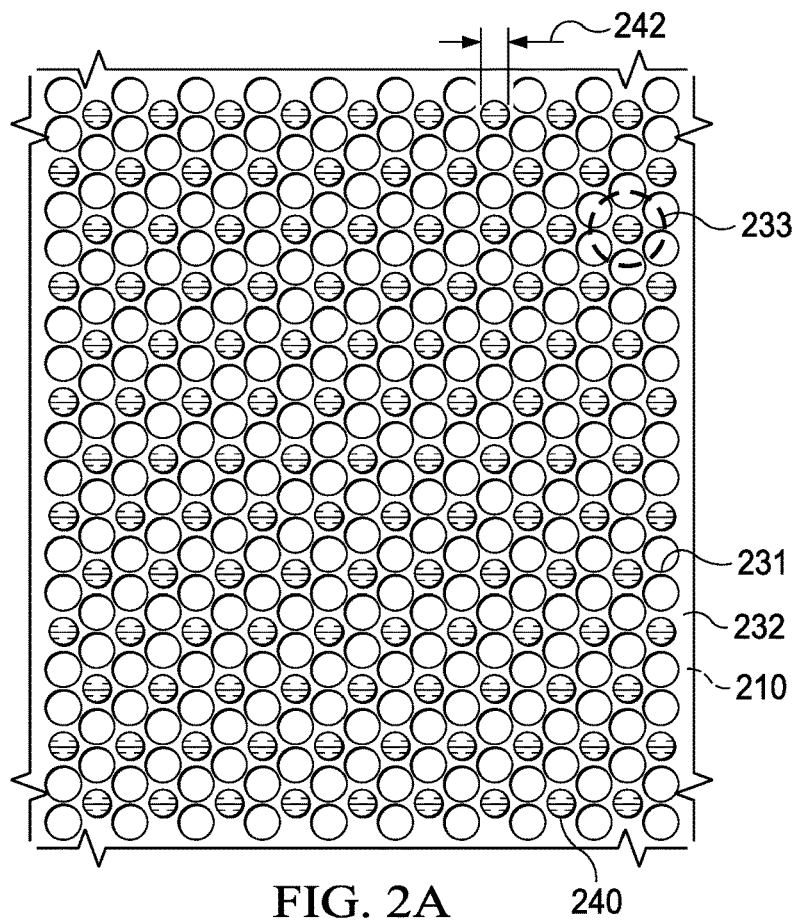
FIG. 2A and FIG. 2B illustrate conductor layers and elongated pillars for an arrangement in a plan view and in a projection view, respectively.
Figure 2B:
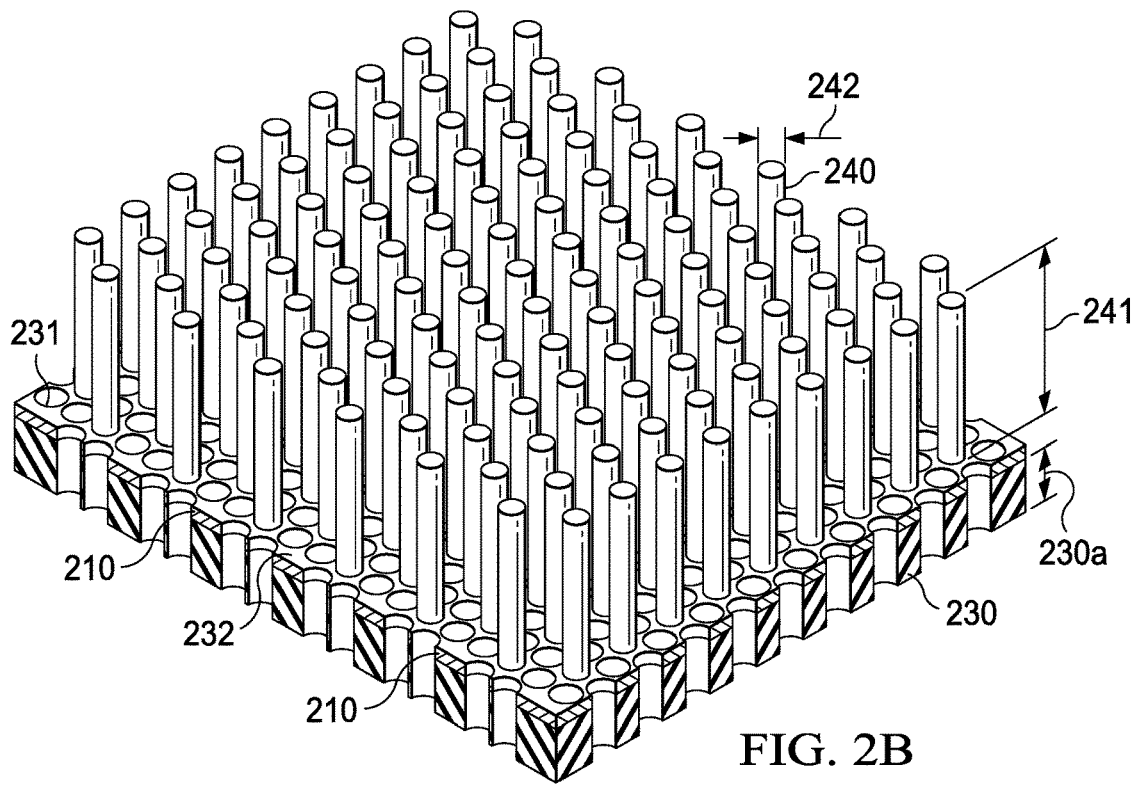

In FIGS. 2A-2B, similar reference numerals are used for elements similar to those shown in FIGS. 1A-1B, for clarity of explanation. The first conductor layer 210 (corresponding to 110 in FIG. 1B) and the insulator layer 230 (which corresponds to layer 130 in FIG. 1B) are illustrated in a top view in FIG. 2A and in a perspective view in FIG. 2B. First conductor layer 210 and insulator layer 230 are patterned by generally equally sized and coincident via openings 231 arrayed in circular polygons labeled 233 surrounding respective central pads 232 of first conductor layer 210. An example circular polygon 233 as exemplified in FIG. 2A is a hexagon consisting of six via openings. In other example arrays, the polygon may be an equilateral triangle, a square, a rectangle, or an octagon. The via openings 231 have a preferably round contour, although other shapes are possible and can be used. Each central pad 232 of first conductor layer 210 has an area large enough to accommodate a first pillar body 240. As seen in the plan view of FIG. 2A, in this illustrated example, via openings 231 are located arranged in a zigzag pattern in orderly rows, with sequential rows alternating the zigzag sequence. In alternative arrangements, other via patterns are possible.

FIGS. 1B, 2A and 2B illustrate that conductive elongated first pillars (140 or 240) with a first height (141 or 241) and a first cross section (142 or 242) are positioned on central pads (232 or 132) of first conductor layer (210 or 110). The first pillars (140 or 240) are shown oriented normal to a surface of first conductor layer (110 or 210) in this example. Elements that are normal to one another have a 90 degree angle between the directions the respective elements are oriented in at an intersection of the elements. As the term "normal" is used herein, it is understood that in manufacturing some variations from the 90 degree angle between the pillars and the conductor layer occur due to the tolerances in manufacturing. As an example, the first height 141 (see FIG. 1B) or 241 may be in the range from about 1 µm to 100 µm.

Figure 3:
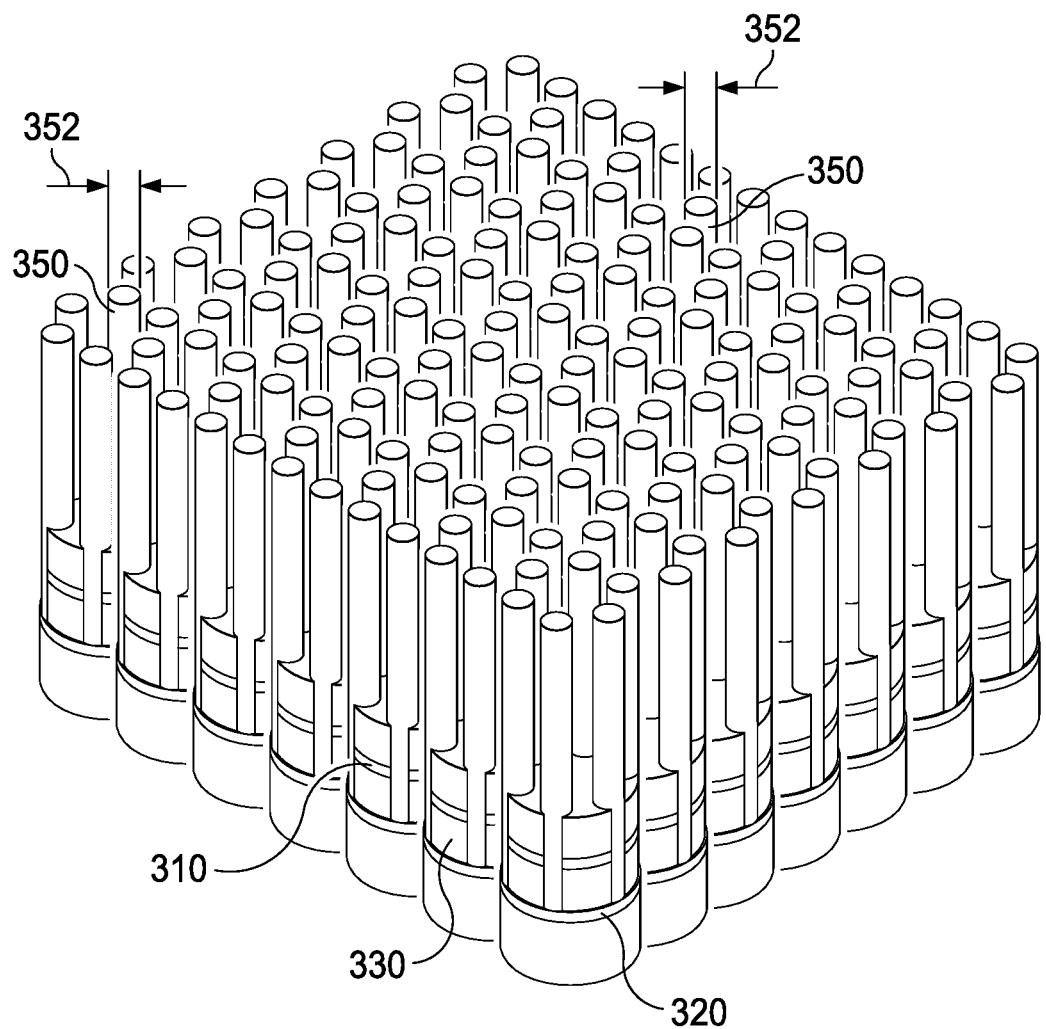
FIG. 3 illustrates in a projection view a set of elongated pillars that form a portion of an arrangement.

In FIG. 3, reference numerals for elements similar to those shown in FIGS. 1A and 1B are similar, for ease of understanding. For example, second pillars 350 in FIG. 3 correspond to second pillars 150 in FIGS. 1A-1B. FIGS. 1A-1B and FIG. 3 illustrate conductive elongated second pillars (150 or 350) of a second height (151 or 351) and having a second cross section (152 or 352), the second pillars positioned in normal orientation on each second conductor layer (120 or 320) location, which is coincident with a via opening. Consequently, each second pillar 350 reaches through a respective via opening. The second height (see 151 in FIG. 1B) is equal to the sum of the first height 141, the thickness of first conductor layer 110, and the thickness of the insulator layer (330 or 130). The second pillars 350 are positioned in vertical orientation to the second conductor layer 320 and extend through the respective via openings.

In example sensor devices, the electrically conductive first pillars and second pillars can be formed of: doped semiconductor materials; metals such as copper and aluminum; graphenes; and composites of these materials. In the latter examples, some pillars may be partially doped semiconductor and partially metallic.

In the examples illustrated in FIGS. 1A, 1B, 2A, 2B, and 3, the first pillars and the second pillars have cylindrical shape and the first cross sections (142 in FIG. 1B) of the first pillars and the second cross sections (152 in FIG. 1B) of the second pillars are circular; the circular circumference may be in the range from about 2 µm to 25 µm. In other examples, however, the cross sections may be elliptical or have other contours with generally smooth surfaces. Examples include cross sections that are square, rectangular, and polygonal in shape. In addition, the first pillars and the second pillars have smooth surfaces along the pillar lengths. For the term "smooth" used herein, it is understood that in manufacturing some variations on surfaces occur due to the tolerances in manufacturing. In further alternative arrangements, the pillars can have tapered sides so that a cross-section at the bottom portion of a pillar is larger than a cross section at the top, or the taper can be reversed so that the top is larger in a cross section than a cross section taken at the bottom of the pillars.

Each first pillar 140 is spaced by equal gaps 160 from the surrounding second pillars 150 (see FIG. 1B). In example sensor devices, the gaps are selected in the range from about 2 µm to about 50 µm. The gaps are filled with a dielectric medium 170, indicated by dots in FIG. 1A.

The dielectric medium 170 has an impedance between the pillars and includes molecules which are ionizable by electric fields. Such electric fields can be generated between the first pillars (140 in FIG. 1B) and the second pillars (150 in FIG. 1B) by applying a voltage difference; such fields alter the impedance of the dielectric medium. The dielectric medium may be air, gases, fluid or biological fluid, and the ionizable molecules include water molecules, gas admixtures, and dissolved molecules.

Figure 4A:
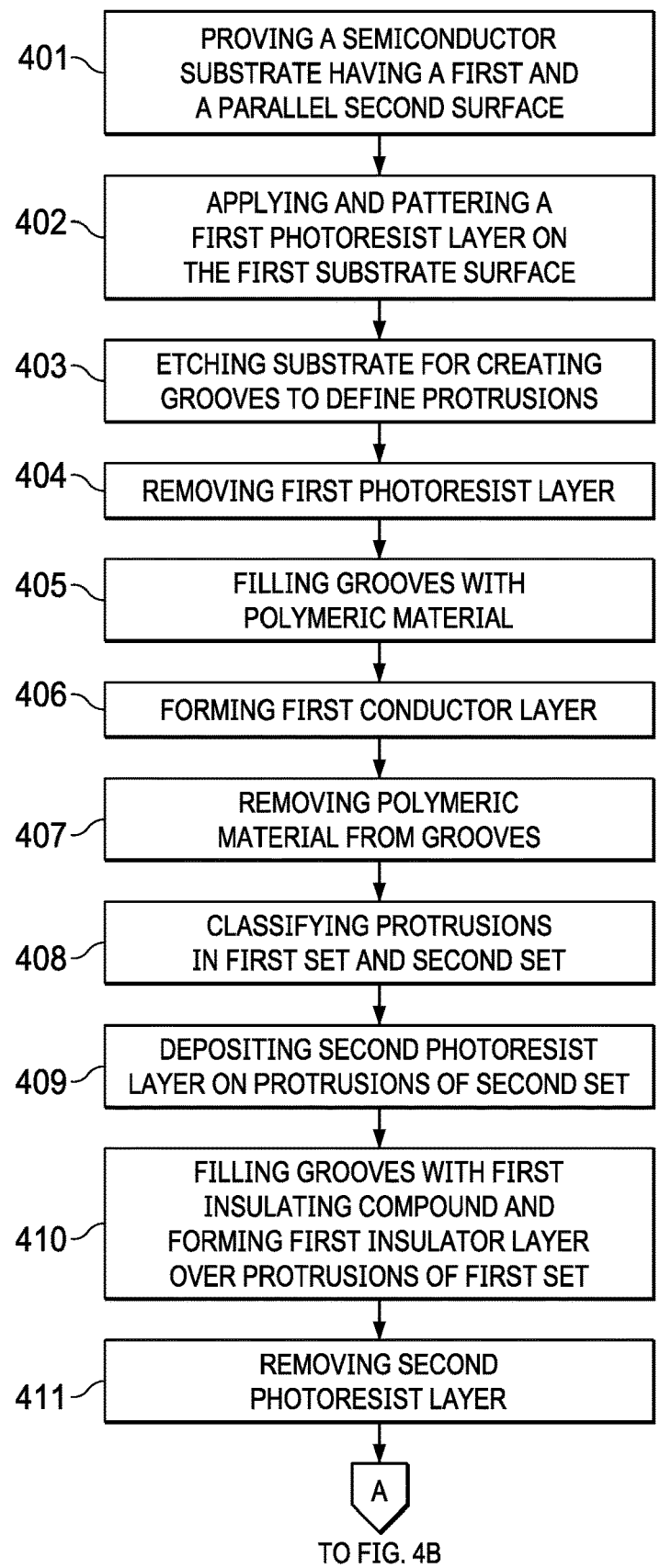
FIGS. 4A-4B illustrate in flow diagrams methods for forming sensors of the arrangements.
Figure 4B:
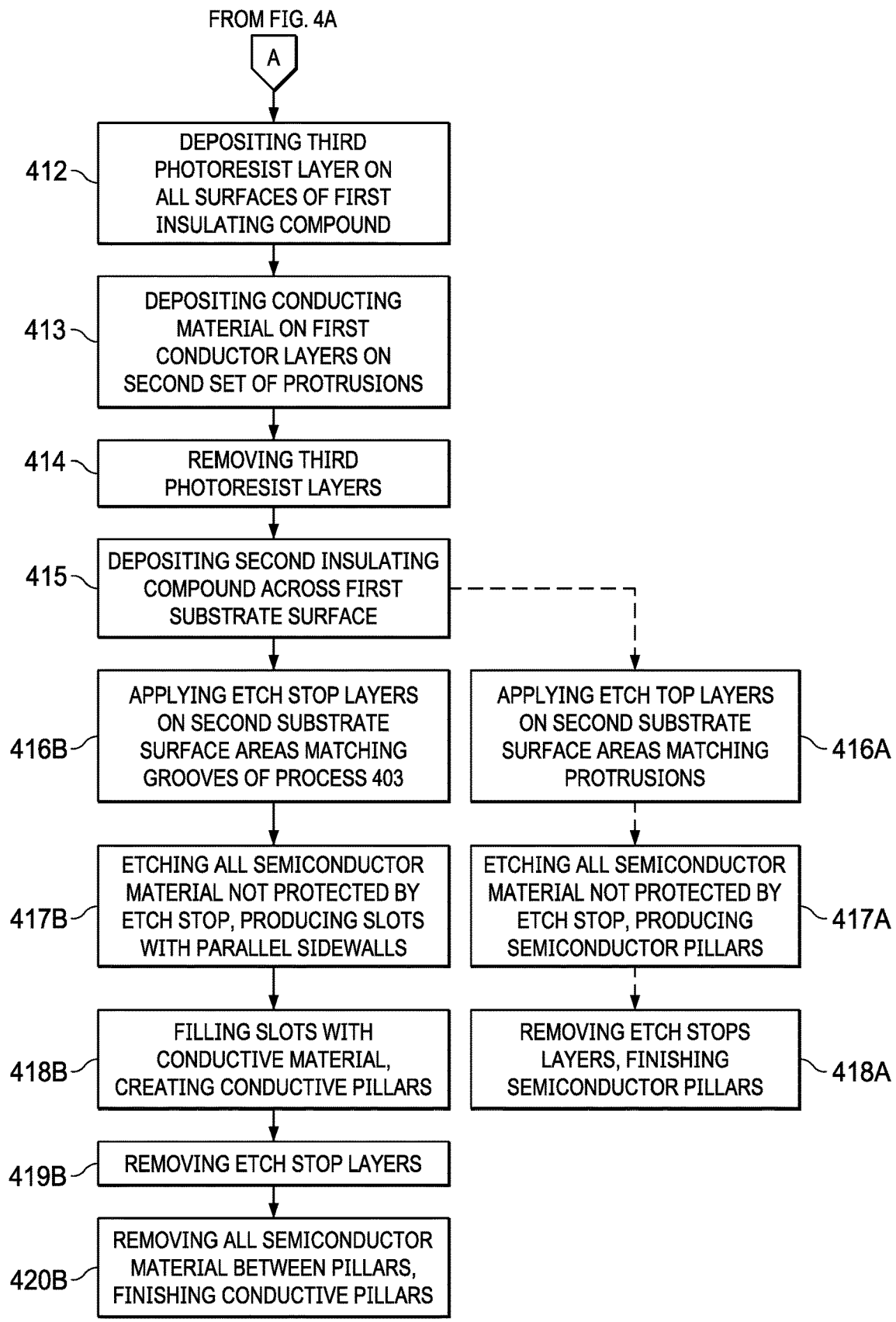

FIGS. 4A-4B summarize the steps of the fabrication process flow of an exemplary semiconductor sensor device for a packaged semiconductor device. Some of the process steps are illustrated in a series of cross sections in FIGS. 5A thru 5M. These steps are then followed either by FIGS. 6A to 6C or in an alternative method, by FIGS. 7A to 7D. Referring to the process flow that begins in FIG. 4A, during step 401 of the process flow, a substrate of semiconductor material is provided. The semiconductor material may be silicon, silicon germanium, gallium arsenide, gallium nitride, other III-V or II-IV compound, or any other semiconductor compound used in manufacturing. In FIGS. 5A to 5M, FIGS. 6A to 6C or FIGS. 7A to 7D, the reference numerals used are similar for similar elements as in FIGS. 1A-1B, for clarity of explanation. For example, in FIG. 5A substrate 500 corresponds to substrate 100 in FIG. 1A-1B. Substrate 500 may be a semiconductor wafer with a planar first surface 501 and a parallel second surface 502. An integrated circuit (not shown for clarity of explanation) may be fabricated in one of the substrate surfaces, for instance in first surface 501. The integrated circuit can include circuitry to control operation of a sensor by applying voltages to the conductive pillars, measuring impedance between the conductive pillars, and outputting observed results as data for use by a system, for example.

Figure 5A:
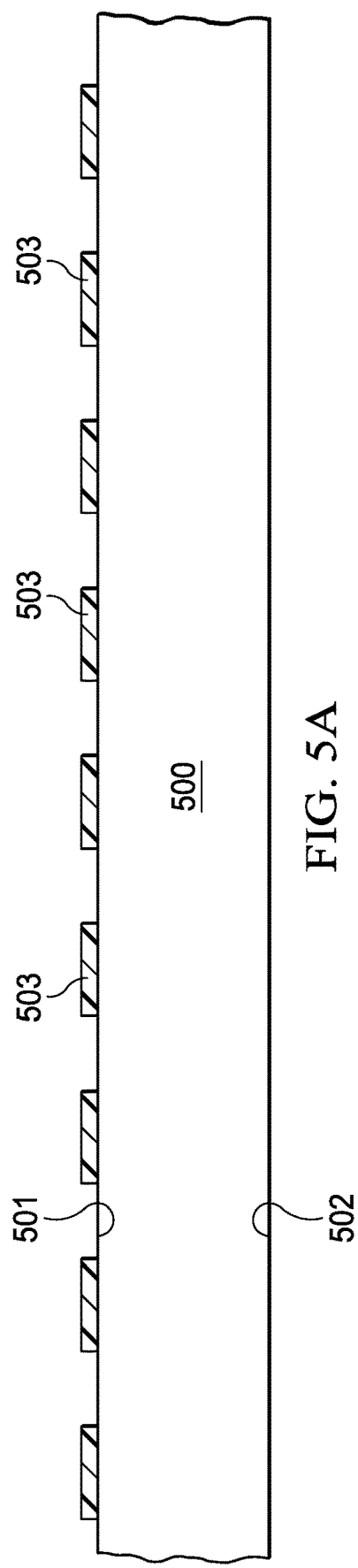
Figure 5B:
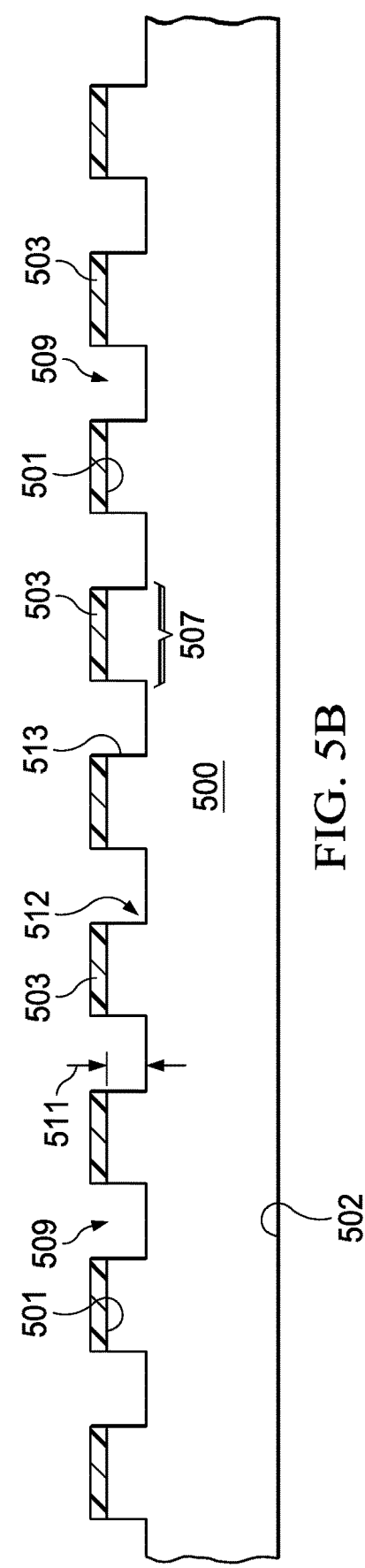

The next process steps define the creation and the patterning of a first conductor layer (see 510 shown in FIG. 5E). During step 402 of the process flow of FIG. 4A and illustrated in the cross section of FIG. 5A, a first layer of photoresist 503 is applied to first surface 501 and patterned so that the remaining areas 503 of the photoresist layer determine the future areas of first conductor layer (510 in FIG. 5E). During step 403 and illustrated in FIG. 5B, grooves 509 are etched from the first surface 501 vertically into the bulk of the substrate 500. In an example process, grooves 509 have equal depths 511, flat bottoms 512, and sidewalls 513 that are vertical relative to the first surface 501 as oriented in FIGS. 5A-5M. As used herein, an element is "flat", if it is level, even and smooth. In other arrangements, the grooves can have different shapes. In example arrangements, the grooves can have sloping sidewalls that intersect a plane of the surface of the substrate at an angle and that are etched vertically into the substrate. In an example, the grooves can be V-shaped and the sidewalls can meet one another at the bottom of the groove. In manufacturing, some variations on surfaces may occur due to the tolerances of manufacturing even in a surface intended to be smooth and even. The term "flat" used herein means a surface intended to be smooth and even. Grooves 509 are shaped as a network of pads and interconnections defining protrusions 507 of un-etched semiconductor material having the first surface 501, in an example the protrusions 507 are located zigzag in orderly rows with sequential rows alternating the zigzag sequence. In this example, the protrusions 507 may be circular in cross section. In alternative arrangements, the protrusions may be oval in cross section or have another shape.

Figure 5C:
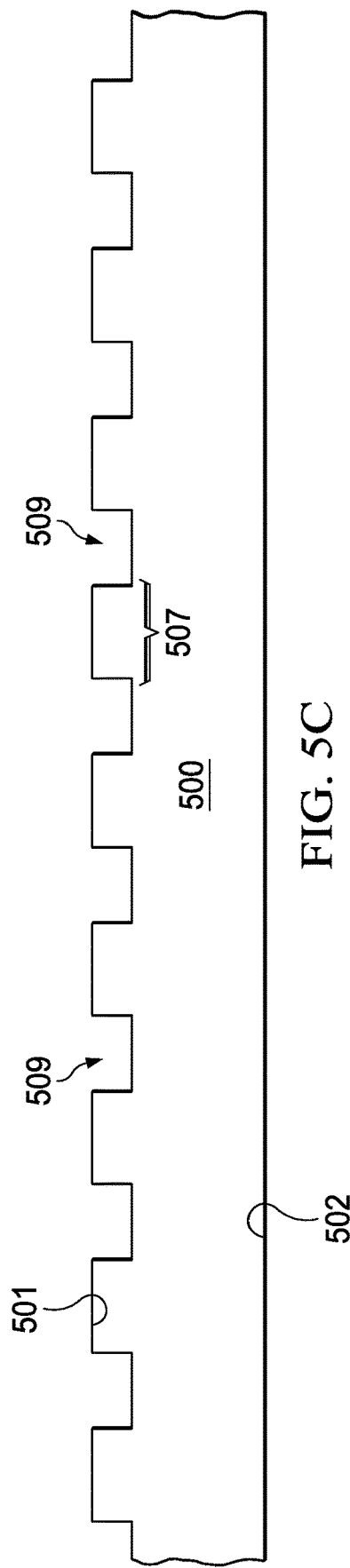
Figure 5D:
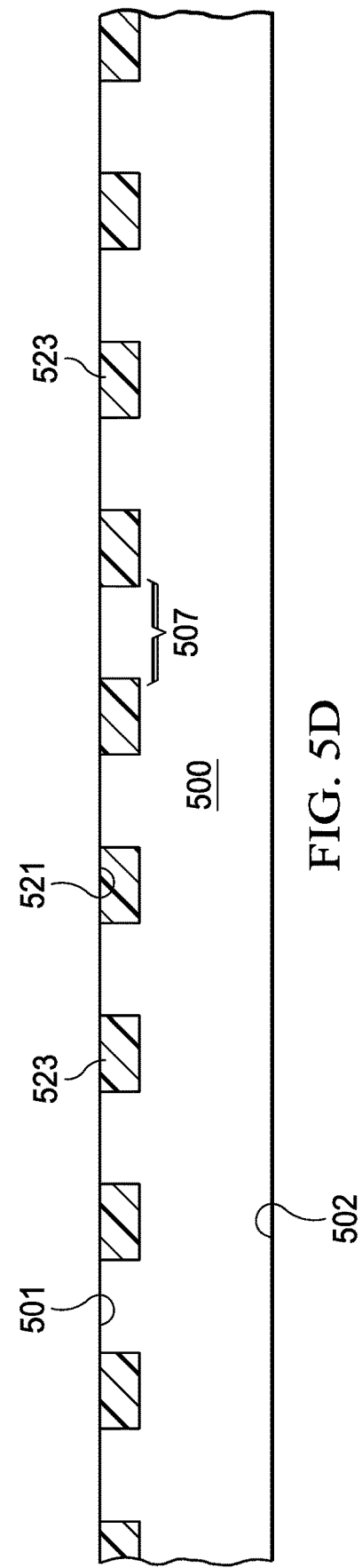

Referring again to the process flow of FIG. 4A, during step 404 and illustrated in FIG. 5C, the first photoresist layers 503 are removed from the protrusions 507. During step 405 and illustrated in FIG. 5D, the grooves 509 are filled with a polymeric material 523 until the surface 521 of the polymeric material 523 is coplanar with the first surface 501 of the protrusions 507.

In the description hereinbelow, certain elements are described as "coplanar." Coplanar elements lie in the same plane. However, in manufacturing some variations of surface heights occur due to the tolerances of manufacturing. The term "coplanar" used herein means two elements intended to be in the same plane, even if slight differences in one or the other of the surfaces as manufactured are slightly out of plane. Elements positioned so that the surfaces of the two elements are intended to lie in a common plane are coplanar.

During step 406 of the process flow in FIG. 4A, and illustrated in FIG. 5E, a first conductor layer 510 is formed by depositing electrically conductive material of uniform height onto the first surface 501 of the protrusions 507. The electrically conductive material for the first conductor layer may include metals (such as copper and aluminum), metal alloys, graphenes, and doped semiconductor materials. During step 407 of the process flow in FIG. 4A, and illustrated in FIG. 5F, the polymeric material 523 in the grooves 509 is removed, thereby re-opening the grooves 509 and freeing the protrusions 507 with first conductor layers 510 on the first surfaces 501.

During step 408 of the process flow in FIG. 4A, the plurality of protrusions 507 is classified into a first set and a second set. The classification is done so that protrusions of the first set are spaced by gaps from protrusions of the second set. In the described example the gaps (see 160 in FIG. 1A) are equal. In an alternative arrangement, unequal gaps could be used. In FIG. 5F, protrusions of the first set are marked by the designator "I" and protrusions of the second set are marked by the designator "II." A one-dimensional example of a similar classification is illustrated in FIG. 1A by the pillars positioned along line A-A. A two-dimensional result of this classification of the protrusions is a configuration of the protrusions in which a protrusion of the first set is surrounded by a circular polygon formed of protrusions of the second set. An example is illustrated in FIG. 2A by circular polygon 233.

Figure 5G:
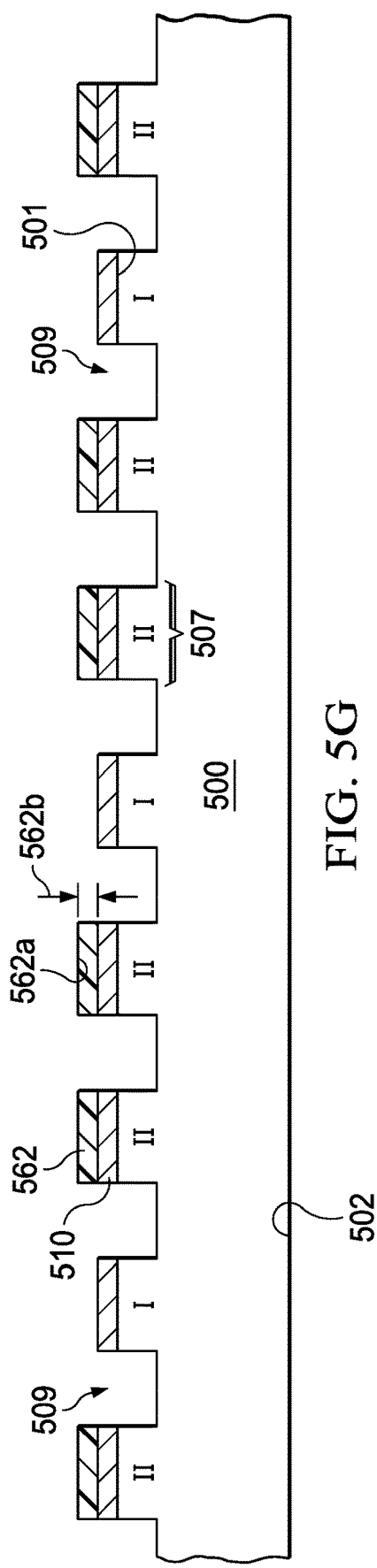

During step 409 of the process flow in FIG. 4A, and illustrated in FIG. 5G, a second photoresist layer 562 is deposited onto the first conductor layers 510 on top of each protrusion of the second set of protrusions (designated II). The second photoresist layer has a surface 562a and a thickness 562b.

Figure 5H:
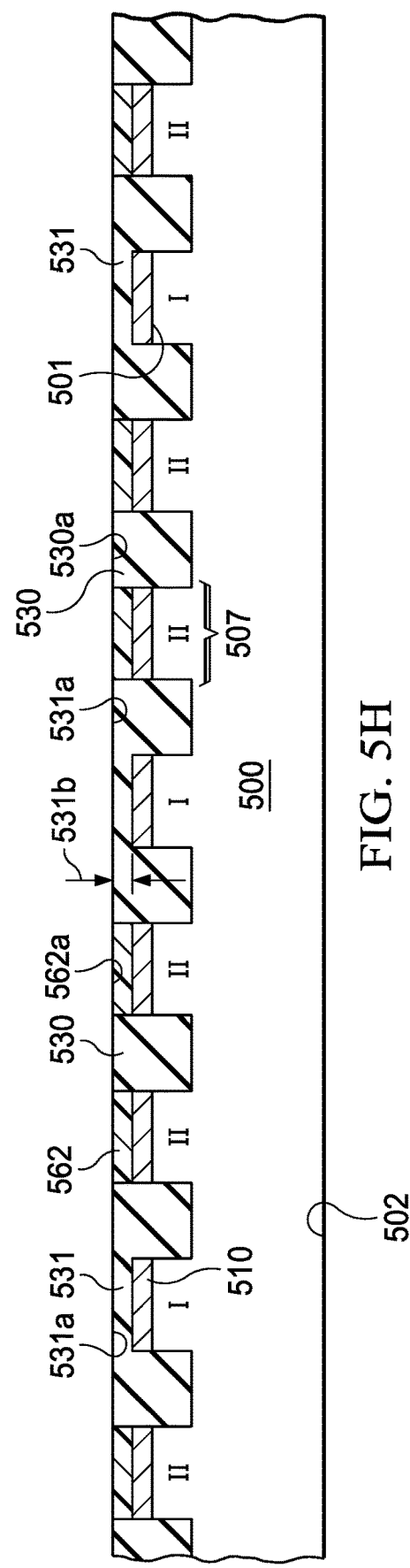

During step 410 of the process flow in FIG. 4A, and illustrated in FIG. 5H, the grooves (509 in FIG. 5G) are filled with a first insulating compound 530. In an example the compound 530 is a dielectric material such as silicon oxide $SiO_x$ (for instance $SiO_2$). Other insulators used as dielectric material in semiconductor processes can be used. The filling process continues until the surface 530a of the insulating compound is coplanar with the surface 562a of the second photoresist layer 562. As a consequence of this filling method and concurrent with this filling process, a coplanar layer 530 of first insulating compound is formed across the conductor layers 510 of the first set protrusions (designated with I). These coplanar layers of the first insulating compound 530 are referred to herein as first insulator layer (the first layer portion visible in FIG. 1B is designated 130). The first insulator layer 530 has the thickness 530b over the first set of protrusions that is equal to thickness 562b (see FIG. 5G) of photoresist layer 562.

Figure 5I:
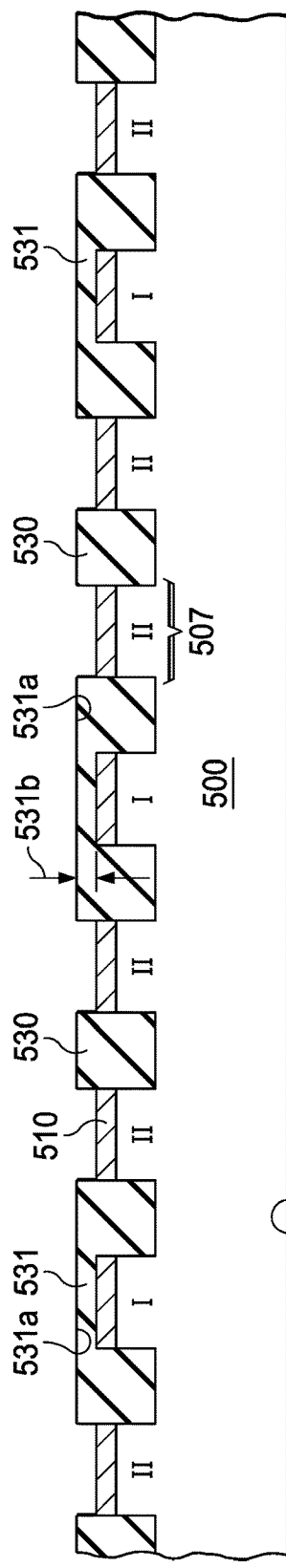

During step 411 of the process flow in FIG. 4A, and illustrated in FIG. 5I, the second photoresist layer (see 562 in FIG. 5H) is removed. Now the insulator layer has two different shaped portions; portions 530 are those between the second set of protrusion II, and portions 531 are those that lie over the first set of protrusions, I. As a consequence, height differences corresponding to thickness 531b are created between the surface portions occupied by the first insulator layers 531 and the surface portions showing the unprotected surface of the first conductor layer 510. The next process step in the method will enlarge these height differences. Note that the process flow of FIG. 4A continues in FIG. 4B.

Figure 5J:
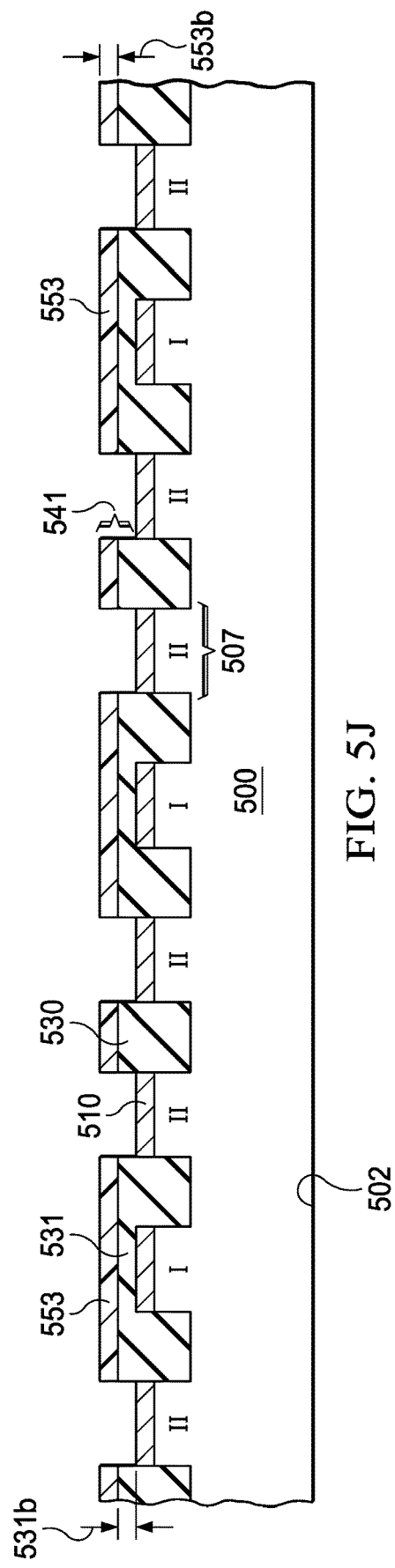

In order to enlarge the height differences during step 412 of the process flow in FIG. 4B, and illustrated in FIG. 5J, a third photoresist layer 553 is created and added on top of all surfaces of first insulating compound 530, including on top of the portions of first insulator layer 531. Third photoresist layer 553 has a thickness 553b. As FIG. 5J illustrates, third photoresist layer 553, in combination with first insulating compound 530, forms a sidewall 541 around each conductor layer 510 on the second set protrusions II. The height of the sidewalls 541 is the sum of the thickness 553b of the third photoresist layer 553 and the thickness 531b of the portions of the first insulator layer labeled 531.

During step 413 of the process flow in FIG. 4B, and illustrated in FIG. 5K, additional electrically conductive material 520 is deposited onto the first conductor layer 510 on the second set protrusions (labeled II). The conductive material 520 can include metals, metal alloys, graphene, and doped semiconductor compounds. The conductive material 520 may be identical with the conductive material 510; as an example, conductive material 510 and conductive material 520 include copper and/or copper alloys. The deposition continues until the added conductive material 520 achieves a surface 520a coplanar with the surface 553a of the third photoresist layer 553. The added conductive material forms a second conductor layer 520 which is parallel to the first conductor layer 510.

During step 414 of the process flow in FIG. 4B, and illustrated in FIG. 5L, the third photoresist layer 553 is removed. As a consequence, height differences 520b are created between the surface 531a of the portions of the first insulator layer 531 and the surface 520a of the conducting material 520. The next process step aims at levelling these height differences.

During step 415 of the process flow in FIG. 4B, and illustrated in FIG. 5M, another insulating compound is deposited across the surfaces of the portions of the first insulator layer 531 and the conductive material 520, leveling the height differences and additionally covering the whole first substrate surface. In addition, another layer of the insulating compound 559 adds a continuous planar insulating layer 561, designated insulator layer 561, with a thickness 561b across the area of the first substrate surface. The new "first" surface of substrate 500 is insulating and is designated 561a. For reasons of mechanical stability and protection, it is advantageous for some applications (see the corresponding layer 161 in FIG. 1B) to provide relatively large thickness for the insulator layer (561 in FIG. 5M).

Figure 6B:
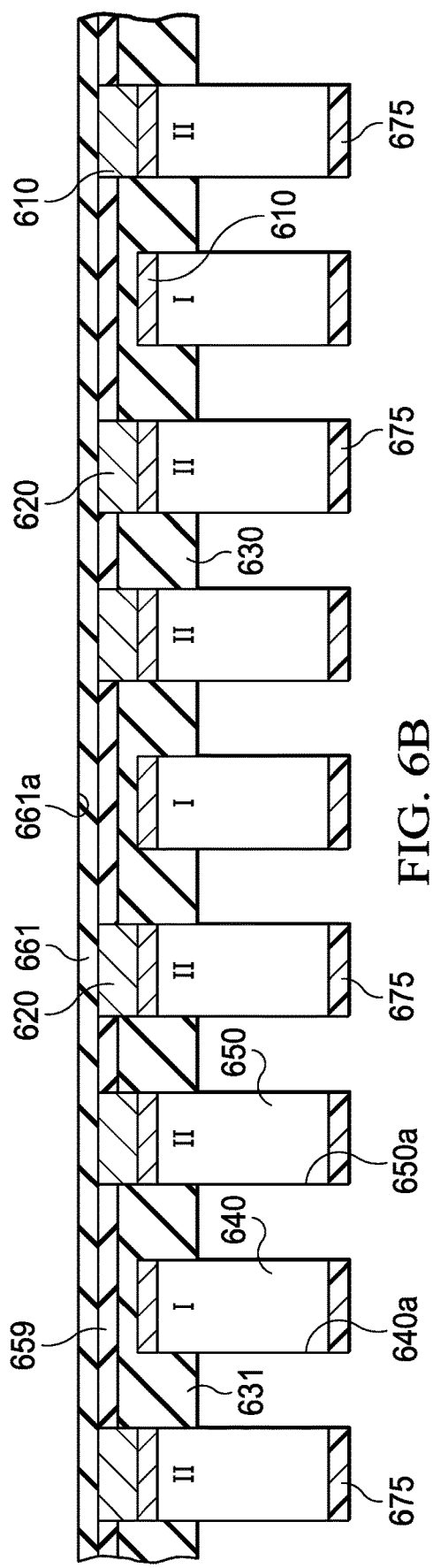
Figure 6C:
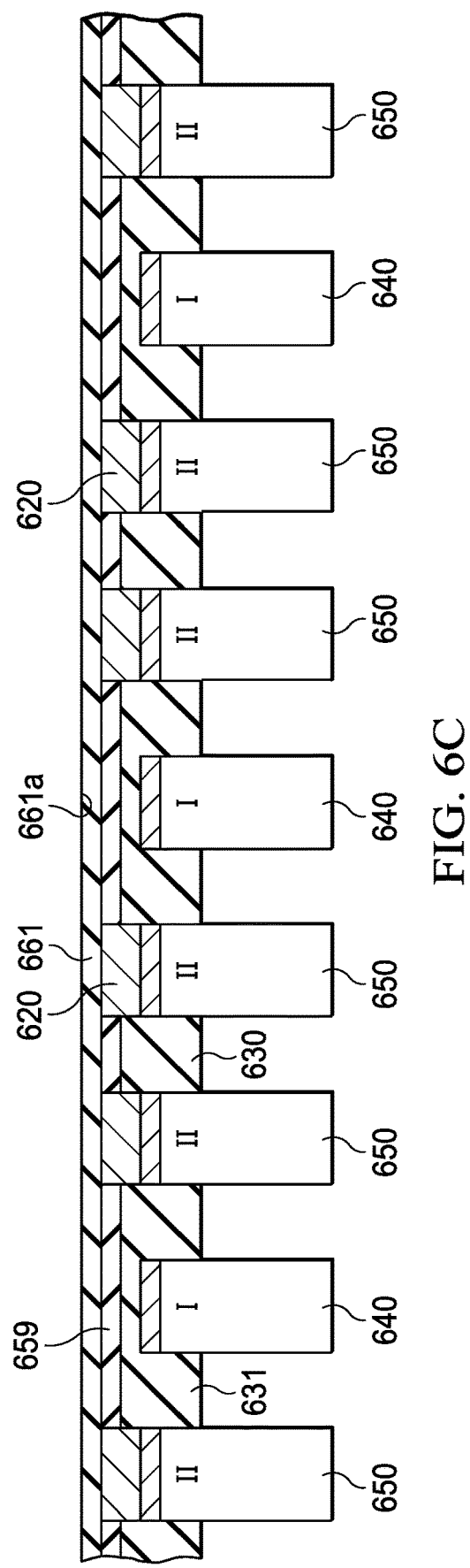

At this stage of the process flow, there is a choice of two processes for creating conductive pillars or electrodes for the sensor device: The first approach employs the electrically conductive semiconductor of the substrate for creating the pillars; this process is illustrated by a series of cross sections showing process steps in FIGS. 6A to 6C and corresponds to steps 416A, 417A, 418A in FIG. 4B. The second approach replaces the electrically conductive semiconductor material by another electrically conductive material such as a metal. This approach is illustrated in cross sections showing process steps in FIGS. 7A to 7D, and corresponds to process steps 416B-420B in FIG. 4B. Note that the reference labels used for similar elements in FIGS. 6A-6C are similar to those in FIGS. 5A-5M, for ease of explanation. For example, substrate 600 corresponds to substrate 500.

Following the first approach, during step 416A of the process flow in FIG. 4B, and illustrated in FIG. 6A, layers 675 of etch-stop material are deposited in spots on the second surface 602 of the substrate 600, which match the positions and surface areas of the protrusions (labeled I) of the first set and the protrusions (labeled II) of the second set. As mentioned above, surface areas of the protrusions may be circular.

During step 417A of the process flow in FIG. 4B, and illustrated in FIG. 6B, the semiconductor material of semiconductor substrate 600 (see FIG. 6A) is etched in the places not protected by the etch-stop spots 675. It is preferred that the etching process use a chemical solution suitable for preferential etching for the chosen crystalline orientation of the single-crystal substrate 600. The etching process progresses from the second surface 602 vertically into the bulk of substrate 600 and continues until the insulating compound 630 is reached. At this point, the etching process comes to a halt, since the remaining un-etched semiconductor material is protected by insulator 630. As FIG. 6B shows, the etching process results in elongated first pillars 640 in locations of protrusions I of the first set, and second pillars 650 in locations of protrusions II of the second set. Due to the preferential etching along crystalline orientation, the sidewalls of the pillars (640a and 650a respectively) are parallel and smooth. It is also preferred that the pillars have circular cross section.

During step 418A of the process flow in FIG. 4B, and illustrated in FIG. 6C, the etch-stop layers 675 are removed, exposing the pillar tops. As a result, all surfaces of the elongated conductive pillars (640 for the first set of protrusions, 650 for the second set) are free to participate as electrodes when electrical bias is applied.

Figure 7A:
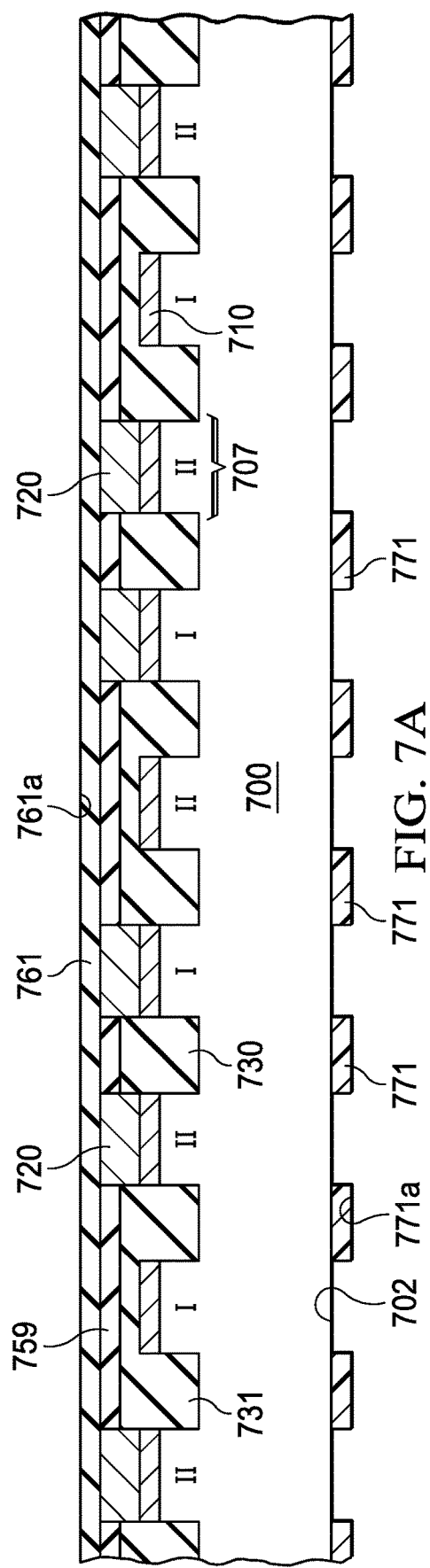
FIGS. 7A-7D illustrate in additional cross sectional views the results of steps of FIG. 4B for an alternative method for forming pillars for use in the arrangements.

Following the second route, during step 416B of the process flow in FIG. 4B, and illustrated in FIG. 7A, layers 771 of etch-stop material are deposited in spots on the second surface 702 of the substrate 700, which match the positions and surface areas of the network of pads and interconnections employed for creating the grooves 509 (in FIG. 7A, the grooves are shown filled with first insulating compound 730, and 731). The etch-stop layers leave circular surface areas unprotected since, as discussed earlier, grooves 709 defined the circular protrusions of first set I and second set II. The layers 771 of etch-stop material have surfaces 771a.

Figure 7B:
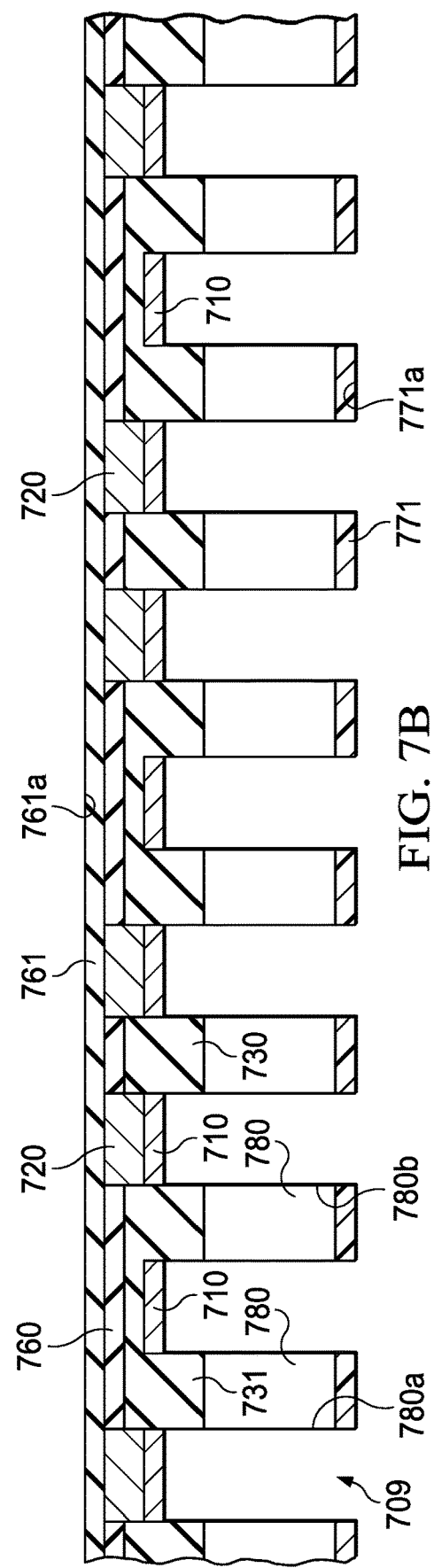

During step 417B of the process flow in FIG. 4B, and illustrated in FIG. 7B, that portion of semiconductor material of substrate 700 (see FIG. 7A) which is not protected by the etch-stop layers 771 is etched. It is preferred that the etching process use a chemical solution suitable for preferential etching of the chosen crystalline orientation of the single-crystal substrate 700. The etching process progresses from the second surface 702 vertically into the bulk of substrate 700, etching away the protrusions of set I and set II, and continues until the deposited conductors 710 are reached. At this point, the etching process is complete. As FIG. 7B shows, the etching process has produced slots 709 with parallel sidewalls 780a and 780b. Along the lengths, the sidewalls are composed partially of the semiconductor material 780 of substrate 700 and partially of the first insulating compound 730 and 731. Due to the manner in which preferential etches attack crystalline orientations, the sidewalls of the slots 709 are smooth. For many products, the slots are preferred to have circular cross section. In alternative arrangements, the cross sections may be oval or have other shapes.

Figure 7C:
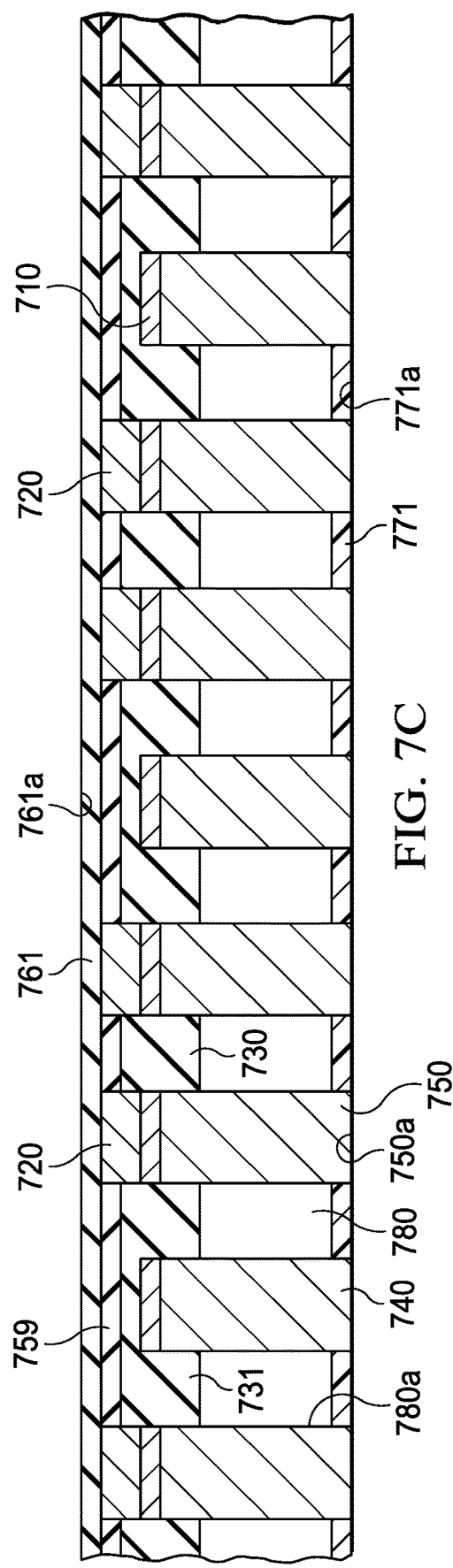

During step 418B of the process flow in FIG. 4B, and illustrated in FIG. 7C, the slots 709 (see FIG. 7B) are filled in their whole length and width with electrically conductive material 740, and 750, for the first and second sets of protrusions. The filling process continues until the surface 750a of the conductive material is coplanar with the surface 771a of the etch-stop layer 771. As a result, illustrated in FIG. 7C, the filling process forms elongated pillars 740, 750 wholly constituted of electrically conductive material; the pillars have parallel sidewalls. The conductive material can be of metals, metal alloys, graphene, and doped semiconductor compounds. Examples for metals are copper and aluminum and alloys of these. Preferably, the conductive material in pillars 740, 750 is identical with the conductive material 110 (in FIG. 1A) and the conductive material 720; as an example, conductive material 750 as well as conductive materials 7100 and 720 include copper.

Figure 7D:
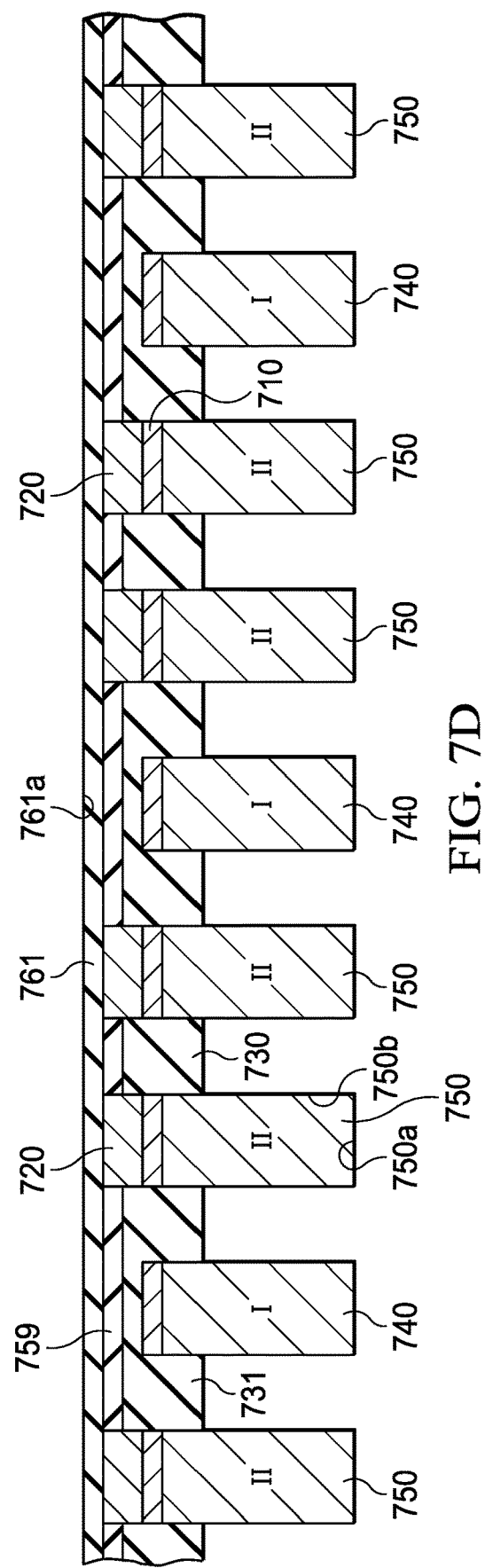

During step 419B of the process flow in FIG. 4B, and illustrated in FIG. 7D, the etch-stop layers 771 are removed. Thereafter, during step 420B of the process flow in FIG. 4, and also illustrated in FIG. 7D, the semiconductor material 780 (see FIG. 7C), previously protected by the etch-stop layers 771, is also removed, thereby freeing the sidewalls 750b of the conductive material. As a result, elongated pillars 740, 750 have been produced, which consist wholly of electrically conductive material such as metal. This plurality of pillars 740, 750 includes pillars 740 designated with label I, which take the place of the first pillars 140 in FIGS. 1A and 1B, and pillars 750, designated with the label II take the place of the second pillars 150 in FIGS. 1A and 1B. Pillars 740 and pillars 750 can operate as first and second electrodes using set I and set II pillars when electrical bias is applied. When the medium (170 in FIG. 1A) is ionized by the electrical bias between the electrodes, a change in impedance can be sensed. In an example, the moisture content of air can be determined using ionization. Gas concentrations, blood gas concentrations, fluid chemistry, and other measurements can be similarly made.

Figure 8A:
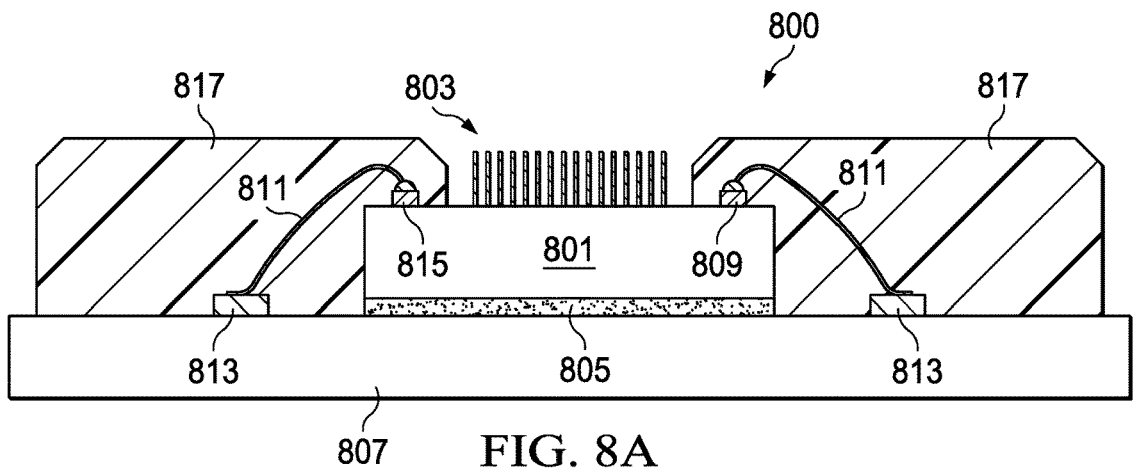
FIGS. 8A-8B illustrate in two cross sectional views two alternative packaged sensor device arrangements.
Figure 8B:
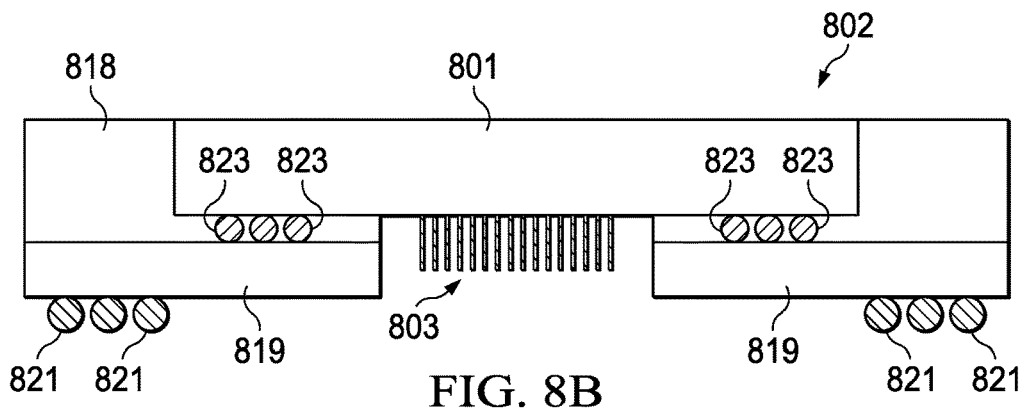

FIGS. 8A-8B illustrate in cross sectional views packaged sensor devices. In FIG. 8A, a wire bonded packaged sensor device arrangement 800 is shown. A substrate 807, for example a lead frame such as a copper lead frame or other substrate used in electronic packages, is shown having a semiconductor device 801 attached on a first surface by die attach adhesive 805. Lands 813 on the substrate are coupled to bond pads 815 on an active surface of the semiconductor device 801 by bond wires 811. Mold compound such as epoxy, polyimide, epoxy resin or thermoset epoxy resin forms portions 817 which cover the bond wires 811 and the first surface of substrate 807. A remaining portion of substrate 807 is exposed from the mold compound 817 and can form external terminals (not shown for simplicity of illustration) for the arrangement 800. Sensor 803 is shown formed on the active surface of semiconductor device 801 and exposed from the mold compound portion 817, to enable the sensor to allow the medium (for example, the ambient) to be present in the gaps between the conductive pillars where ionization can take place.

FIG. 8B illustrates in a similar cross sectional view a packaged sensor device arrangement 802 similar to that of FIG. 8A, using a flip chip mounted semiconductor device 801. The package for arrangement 802 has the semiconductor device 801 mounted "face down" (with respect to package 800); so that the sensor 803 extends downwards towards a system board (not shown) where the packaged sensor device 802 would be surface mounted. Solder 823, which can be solder balls or conductive pillar bumps with solder bumps, form connections between bond pads on the active surface of semiconductor device 801 and the substrate 819, which can be a printed circuit board, ceramic, laminate, tape or film and which can carry layers of conductors such as redistribution layers. Solder balls 821 are coupled to lands on the exterior surface of substrate 819 to provide electrical terminals for the packaged sensor device arrangement 802. The package can be sealed using mold compound, epoxy, or resin 818 to cover part of the semiconductor device 801 while leaving the conductive pillars of sensor 803 exposed to the ambient.

Figure 9A:
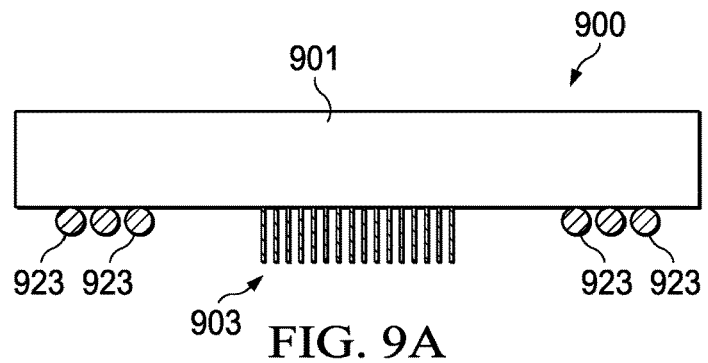
FIGS. 9A-9B illustrate in cross sectional views two alternative arrangements for a sensor device.
Figure 9B:
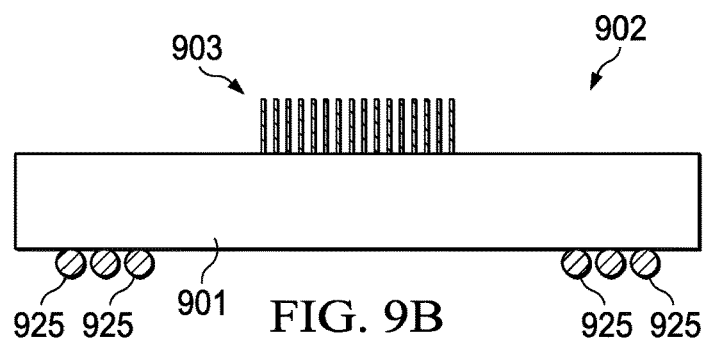

FIGS. 9A and 9B illustrate in cross sectional views two possible arrangements for a sensor and semiconductor device. In an arrangement 900 shown in FIG. 9A, the sensor 903 including the conductive pillars that extend towards a system board (not shown) where the semiconductor device 901 is to be mounted using solder balls 923. In FIG. 9B, in an alternative arrangement 902, the sensor 903 is oriented on the opposite side of the semiconductor device 901 and the conductive pillars point away from a system board (not shown) that semiconductor device 901 will be surface mounted to using solder balls 925.

In each of FIGS. 8A-8B, 9A-9B, the semiconductor device (801 or 901) can provide the sensors 803, 903. In some example arrangements, the semiconductor device 801 or 901 can include additional integrated circuitry. For example, a controller or processor can be provided on the same semiconductor device 801, 901 as the sensor 803, 903 and can apply bias voltages to the conductive pillars. In still additional alternatives, the semiconductor devices 801, 901 in FIGS. 8A-8B, 9A-9B, can be discrete sensor devices that can be coupled to other integrated circuits (not shown) that provide control and voltages needed to operate the sensors. Measurements of current, voltage, and/or conductivity enable direct measurements of the dielectric during ionization, in an illustrative example a processor can use these measurements in directly measuring humidity or moisture of air or of another dielectric.

Modifications are possible in the described arrangements, and other alternative arrangements are possible within the scope of the claims.

What is claimed is:

1. A packaged semiconductor sensor system, comprising:
a semiconductor device including an integrated circuit;
a sensor coupled to the integrated circuit, the sensor including a first group of conductive pillars spaced from a second group of conductive pillars by a gap, the first group of conductive pillars forming a first electrode, the second group of conductive pillars forming a second electrode, and the sensor configured to form an electrical field between the first electrode and the second electrode so as to ionize a dielectric medium in the gap; and
a package for the semiconductor device and the sensor, in which at least a portion of the sensor is exposed to an external ambient.

2. The packaged semiconductor sensor system of claim 1, in which the integrated circuit includes a current sensing circuitry with a pulsed voltage input.

3. The packaged semiconductor sensor system of claim 1, in which the sensor is an impedance sensor.

4. The packaged semiconductor sensor system of claim 3, in which the impedance sensor is a moisture sensor.

5. The packaged semiconductor sensor system of claim 1, in which the package includes a mold compound.

6. The packaged semiconductor sensor system of claim 1, in which the semiconductor device is attached to, and electrically connected to at least a portion of a substrate.

7. The packaged semiconductor sensor system of claim 1, in which the semiconductor device is electrically connected to at least a portion of a substrate via a bond wire.

8. The packaged semiconductor sensor system of claim 1, in which the dielectric medium in the gaps includes molecules ionizable by electric fields generated between the at least one conductive first pillar of the first group of conductive pillars and the second group of conductive pillars.

9. The packaged semiconductor sensor system of claim 1, in which the package includes a cavity where the sensor is located.

10. A packaged semiconductor sensor system, comprising:
a semiconductor device including an integrated circuit electrically connected to a substrate;
a sensor coupled to the integrated circuit and extending from the semiconductor device, the sensor including a first group of conductive pillars spaced from a second group of conductive pillars by a gap, the first group of conductive pillars forming a first electrode, the second group of conductive pillars forming a second electrode, and the sensor configured to form an electrical field between the first electrode and the second electrode so as to ionize a dielectric medium in the gap; and
a mold compound contacting at least a portion of the semiconductor device and the substrate, in which at least a portion of the sensor is exposed to an external ambient.

11. The packaged semiconductor sensor system of claim 10, in which the semiconductor device is electrically connected to the substrate via a solder ball.

12. The packaged semiconductor sensor system of claim 11, in which the sensor extends from the semiconductor device in a same direction as the solder ball.

13. The packaged semiconductor sensor system of claim 11 further comprising a cavity between the substrate and the mold compound.

14. The packaged semiconductor sensor system of claim 13, in which the sensor is located within the cavity.

15. The packaged semiconductor sensor system of claim 10, in which the dielectric medium in the gaps includes at least a molecule ionizable by electric fields generated between the at least one conductive first pillar of the first group of conductive pillars and the second group of conductive pillars.

16. The packaged semiconductor sensor system of claim 10, in which the substrate includes one of a printed circuit board, ceramic, laminate, tape and film which includes redistribution layers.

17. The packaged semiconductor sensor system of claim 10, in which the substrate includes the solder ball coupled to lands on a surface of the substrate to provide electrical terminals for the packaged sensor device arrangement.

18. The packaged semiconductor sensor system of claim 10, in which the first group of conductive pillars and the second group of conductive pillars includes a material selected from a group consisting essentially of: doped semiconductor materials; metals; graphenes; and alloys and composites thereof.

19. The packaged semiconductor sensor system of claim 15, in which the dielectric medium is one selected from a group consisting essentially of: air; gases; and biological fluids; and the molecules ionizable are ones selected from a group including water molecules, gas admixtures, and dissolved molecules.

\* \* \* \* \*